(12) United States Patent
Abell

(10) Patent No.: US 6,951,810 B2
(45) Date of Patent: Oct. 4, 2005

(54) BARRIER FILM INTEGRITY ON POROUS LOW K DIELECTRICS BY APPLICATION OF A HYDROCARBON PLASMA TREATMENT

(75) Inventor: Thomas Joseph Abell, Oud-Heverlee (BE)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/804,977

(22) Filed: Mar. 18, 2004

(65) Prior Publication Data
US 2004/0175935 A1 Sep. 9, 2004

Related U.S. Application Data

(62) Division of application No. 10/328,838, filed on Dec. 23, 2002, now Pat. No. 6,787,453.

(51) Int. Cl.$^7$ .......................................... H01L 21/4763
(52) U.S. Cl. ...................................... 438/637; 438/638
(58) Field of Search ................................ 438/637–640, 438/643

(56) References Cited

U.S. PATENT DOCUMENTS 6,399,511 B2 * 6/2002 Tang et al. ................. 438/714
2002/0068435 A1 * 6/2002 Tsai et al. ................... 438/637

* cited by examiner

Primary Examiner—Phat X. Cao
Assistant Examiner—Theresa T. Doan
(74) Attorney, Agent, or Firm—Blakely, Sokoloff, Taylor & Zafman LLP

(57) ABSTRACT

A method for treating a dielectric material using hydrocarbon plasma is described, which allows for thinner films of barrier material to be used to form a robust barrier.

6 Claims, 4 Drawing Sheets

BARRIER FILM INTEGRITY ON POROUS LOW K DIELECTRICS BY APPLICATION OF A HYDROCARBON PLASMA TREATMENT

The present patent application is a Divisional of Application No. 10/328,838, filed Dec. 23, 2002 now U.S. Pat. No. 6,787,453.

BACKGROUND OF THE INVENTION

1. Field of the Invention

The invention generally relates to the field of fabricating semiconductor devices. More specifically, it relates to the deposition of barrier films on porous dielectric material.

2. Prior Art

Modern integrated circuits generally contain several layers of interconnect structures fabricated above a substrate. The substrate may have active devices and/or conductors that are connected by the interconnect structure.

Current interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between the metal lines. For some cases, interconnect structures use dielectric materials such as silicon dioxide ($SiO_2$) or silicon oxyfluoride (SiOF). Articles discussing low k dielectrics are: "From tribological coatings to low-k dielectrics for ULSI interconnects," by A. Grill, Thin Solid Films 398–399 (2001) pages 527–532; "Integration Feasibility of Porous SiLK Semiconductor Dielectric," by J. J. Waterloos, et al., IEEE Conference Proceedings, IITC, (June 2001) pages 253–354; and "Low-k Dielectrics Characterization for Damascene Integration, "by Simon Lin, et al., IEEE Conference Proceedings, IITC, (June 2001) pages 146–148.

However, dielectric materials may be extremely porous. The porous nature of dielectric material allows copper formed in the trenches and vias, without a barrier, to diffuse into an underlying layer causing the shorting of two adjacent copper lines or line-to-line leakage. Moreover, the surfaces of dielectric materials often possess openings or gaps where pores are exposed. Therefore, interconnect structures employ a barrier layer over the surface of the dielectric to protect from copper diffusing into the dielectric material. Common materials used for this barrier layer are Tantalum, Tantalum-Nitride, and Titanium Nitride.

Yet, any discontinuity, like discontinuities 130 in FIG. 1a, in a thinly applied barrier film 120 will result in the diffusion of copper atoms or penetration of plating solution into a porous dielectric 110. This diffusion can also cause copper lines to short or leakage from line-to-line to occur. As shown in FIG. 1b, prior art for highly porous dielectrics require the deposition of a thicker barrier layer 140, typically greater than 30 nm, to physically cover the exposed pores to form a continuous barrier. Nevertheless, this thicker barrier layer takes up additional volume in a via or a trench increasing the resistance by reducing the volume available for copper.

BRIEF DESCRIPTION OF DRAWINGS

The embodiments of the present invention are illustrated by way of example and not in the figures of the accompanying drawings, in which references indicate similar elements and in which.

DETAILED DESCRIPTION

A method for improving barrier film integrity on porous dielectrics by application of hydrocarbon plasma treatment is described. In the following description, numerous specific details are set forth, such as specific materials and thicknesses in order to provide a thorough understanding of the present invention. It will be apparent to one skilled in the art that the present invention may be practiced without these specific details. In other instances, well-known processing steps, such as masking and etching steps, have not been described in detail in order to avoid unnecessarily obscuring the present invention.

Figure 1A:
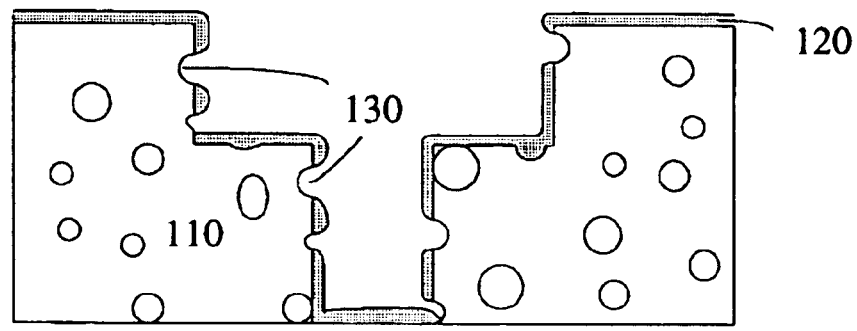
FIG. 1a is a prior art cross-sectional elevation view of a trench and via defined by a porous interlayer dielectric, after a thin barrier layer has been deposited over the surface of the dielectric.
Figure 1B:
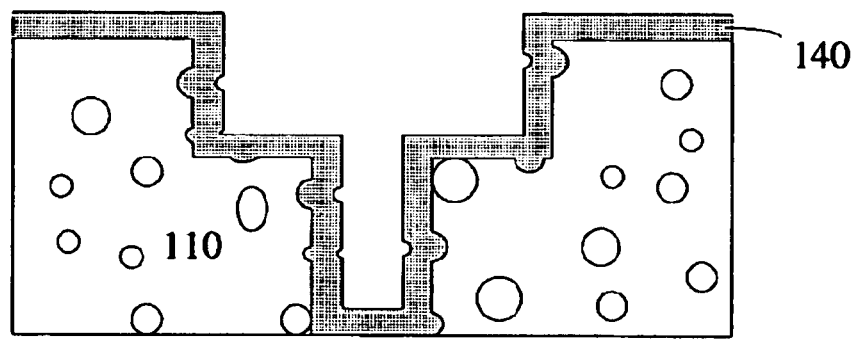
FIG. 1b is a prior art cross-sectional elevation view of a trench and via defined by a porous interlayer dielectric, after a thick barrier layer has been deposited over the surface of the dielectric.
Figure 2:
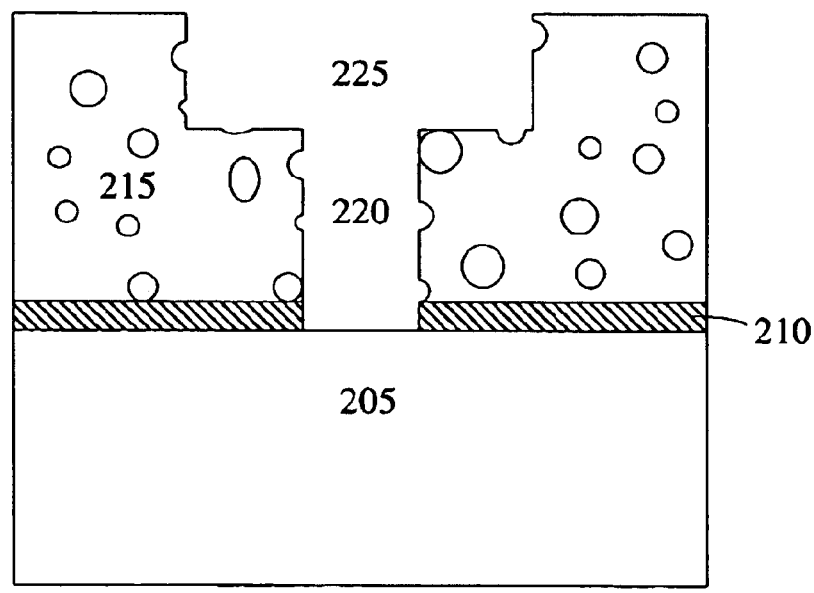
FIG. 2 is a cross-sectional elevation view of a trench and via defined by a porous dielectric material that is disposed above an etch stop/diffusion barrier formed on an underlying layer.

Referring first to FIG. 2, an underlying layer 205 is illustrated, which often is comprised of several active devices and/or a layer with metal exposed. Underlying layer 205 may be a semiconductor wafer including device regions, other structures such as gates, local interconnects, metal layers, or other active/passive device structures or layers. An etch stop/diffusion barrier 210 is also illustrated in FIG. 2, which can be comprised of numerous materials. For example, etch stop/diffusion barrier 210 may be comprised of silicon nitride ($Si_3N_4$) or silicon carbide (SiC).

FIG. 2 further illustrates a porous interlayer dielectric (ILD), such as ILD 215, which is deposited on etch stop/diffusion barrier 210. ILD 215 may be formed from any one of a plurality of known dielectric materials. In one embodiment of the present invention, ILD 215 is formed from a low k dielectric such as a polymer-based dielectric. In another embodiment, a non-organic material such as a carbon-doped oxide with induced porosity is used. In yet another embodiment, Zirkon 2000 is used as the dielectric material. Zirkon 2000 may be spun-coated onto etch stop/diffusion barrier 210, an underlying layer, or a silicon wafer.

One category of low k materials, the organic polymers, are typically spun-on. A discussion of perfluorocyclobutane (PFCB) organic polymers is found in, "Integration of Perfluorocyclobutane (PFCB)." By C. B. Case, C. J. Case, A.

Kornblit, M. E. Mills, D. Castillo, R. Liu, Conference Proceedings, ULSI XII.CPOYRGT. 1997, Materials Research Society, beginning at page 449. These polymers are available from companies such as Dupont, Allied Signal, Dow Chemical, Dow Corning, and others.

Another category of low k materials that may be used in the present invention are silica-based such as the nanopouous silica aerogel and xerogel. These dielectrics are discussed in "Nanoporous Silica for Dielectric Constant Less than 2," by Ramos, Roderick, Maskara and Smith, Conference Proceedings ULSI XII.COPYRGT. 1997, Materials Research Society, beginning at page 455 and "Porous Xerogel Films as Ultra-Low Permittivity Dielectrics for ULSI Interconnect Applications," by Jin, List, Lee, Lee, Luttmer and Havermann, Conference Proceedings ULSI XII.COPYRGT. 1997, Materials Research Society, beginning at page 463.

After forming ILD 215, vias and trenches, such as via 220 and trench 225 in FIG. 2, are etched into ILD 215 and through etch stop/diffusion barrier 210. Ordinary masking and etching processes are used to form trench 220, via 225, and any other trenches or vias needed within ILD 215.

Figure 3:
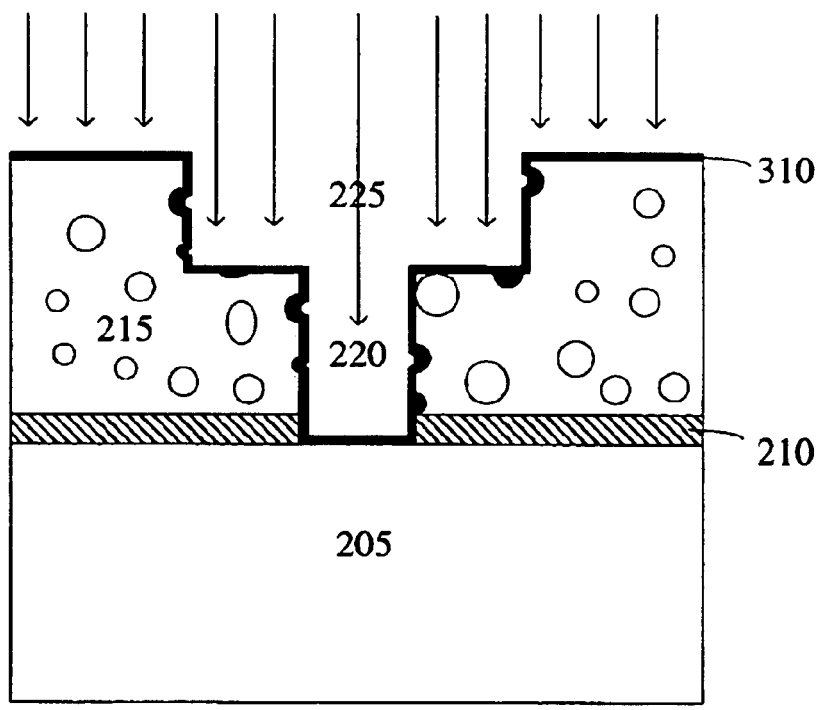
FIG. 3 illustrates the structure of FIG. 2 after the surface of the porous dielectric has been treated.

Next the surface of ILD 215 is treated with hydrocarbon plasma, so as to deposit a thin coating of carbon-rich polymeric material, such as carbon-rich polymer layer 310 in FIG. 3, on the surface of the low k dielectric. The plasma approach allows the deposition of a uniform thin polymer inside small structures, such as via 220 and trench 225, used in advance microelectronic interconnect fabrication.

Hydrocarbon plasma is generated using a hydrocarbon source gas in a plasma chamber. In one embodiment, $C_2H_4$ may be used as the hydrocarbon gas source. In another embodiment, other gas sources may be used including $C_3H_6$, $CH_4$, and other hydrocarbons. Numerous common plasma chambers, from suppliers such as AMAT and Lam, may be used for generating the hydrocarbon plasma. The plasma may be generated over a wider range of variable pressure, power, bias, and time. The following ranges are a non-limitave illustration of the ranges for $C_2H_4$ plasma generation: pressure of 7–60 mTorr, power for 500 W to 1700 W, bias of 0 to 300 W, and for a time 3–10 seconds. As an illustrative example, a $C_2H_4$ plasma may be generated in a Lam 9100 etch chamber at approximately 7 mTorr of pressure, 500 Watts of power, and 0 Watts of bias exposing the dielectric to this plasma for approximately 10 seconds. As another illustrative example, a $C_2H_4$ plasma may be generated in a Lam 9100 etch chamber at approximately 7 mTorr of pressure, 1700 Watts of power, and 300 Watts of bias exposing the dielectric to this plasma for approximately 10 seconds.

Figure 4:
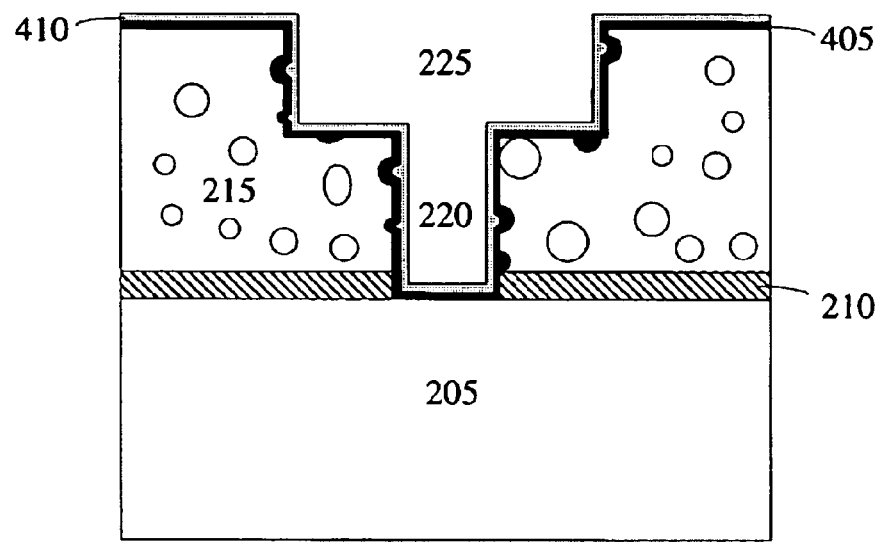
FIG. 4 illustrates the structure of FIG. 3 after a barrier layer is deposited over the treated surface of the interlayer dielectric, so as to line the via and the trench.

As FIG. 4 illustrates, a blanket barrier layer 410, is formed on the treated surface of ILD 215. The barrier material may react with the carbon-rich polymer surface during deposition to form an interfacial carbide layer 405 and may catalyze cross-linking of carbon. In one embodiment, the barrier material is comprised of tantalum (Ta). In another embodiment, the barrier material is comprised of tantalum nitride (TaN). Other materials, such as Ta/TaN bilayers, TiN, WCN, TiSiN, may be used as the barrier material. Tantalum may be deposited using known methods of deposition, such as physical vapor deposition (PVD). Other methods of deposition may include ALD (atomic layer deposition) and MOCVD (metalorganic chemical vapor deposition).

The carbon-rich polymer allows a thinner film of barrier material to be deposited to form a continuous sealed barrier. Even though, the barrier film is thinner than prior art requires, it is a more robust barrier than possible without hydrocarbon plasma treatment. Therefore, one may deposit less than prior art ranges of 30 nm or more of barrier material and receive more protection from penetration. As an illustrative example, experimental evidence shows that 20 nm of tantalum deposited on $C_2H_4$ plasma-treated Zirkon 2000 dielectric, within the aforementioned ranges in generating hydrocarbon plasma, seals the dielectric to toluene vapor. Yet, 20 nm of tantalum on untreated Zirkon 2000 does not seal the Zirkon 2000 to toluene vapor. Furthermore, prior art would require more than 30 nm of tantalum to provide a barrier sufficient to block penetration of toluene.

Figure 7:
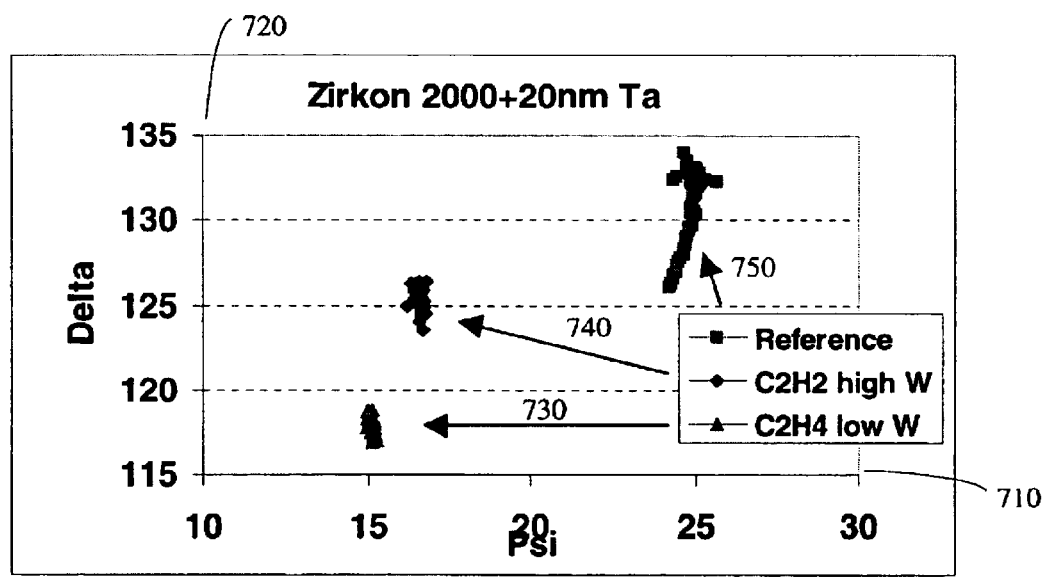
FIG. 7 illustrates the Delta and Psi angles when toluene is used as a probe solvent on 20 nm of Ta deposited over untreated Zirkon 2000 as compared to Zirkon 2000 treated by a high power $C_2H_4$ plasma and a low power $C_2H_4$ plasma.

The following experiment was conducted to experimentally verify the aforementioned illustrative example. Zirkon 2000 was spun-coated onto a 200 mm silicon wafer and cured. Blanket films were then exposed to the hydrocarbon plasma treatment. A $C_2H_4$ plasma was generated in a Lam 9100 etch chamber at approximately 7 mTorr and was exposed to the Zirkon 2000 for 10 seconds. Two different power and bias voltages were applied ($C_2H_4$ high W: 1700 W power and 300 W bias and $C_2H_4$ low W: 500 W power and 0W bias). 20 nm of Tantalum was deposited by PVD in an AMAT Electra SIP chamber on untreated Zirkon 2000 and on Zirkon 2000 exposed to the $C_2H_4$ high W and the $C_2H_4$ low W plasmas. Wafers were then measured for porosity in an XPEQT EP-10 ellisometric porosimetry tool with toluene as the probe solvent. FIG. 7 shows the optical response of the films to the introduction of toluene in a vacuum. Films that allow the penetration and absorption of toluene inside the pore structure will change the optical properties of the film. As FIG. 7 illustrates from curve 750, the untreated Zirkon 2000's optical values Psi (axis 710) and Delta (axis 720) change during the introduction of toluene. In contrast, the two treated films ($C_2H_4$ high W as shown by curve 740 and the $C_2H_4$ low W as shown by curve 730) do not show change in optical properties indicating a sealed barrier film to toluene.

Figure 5:
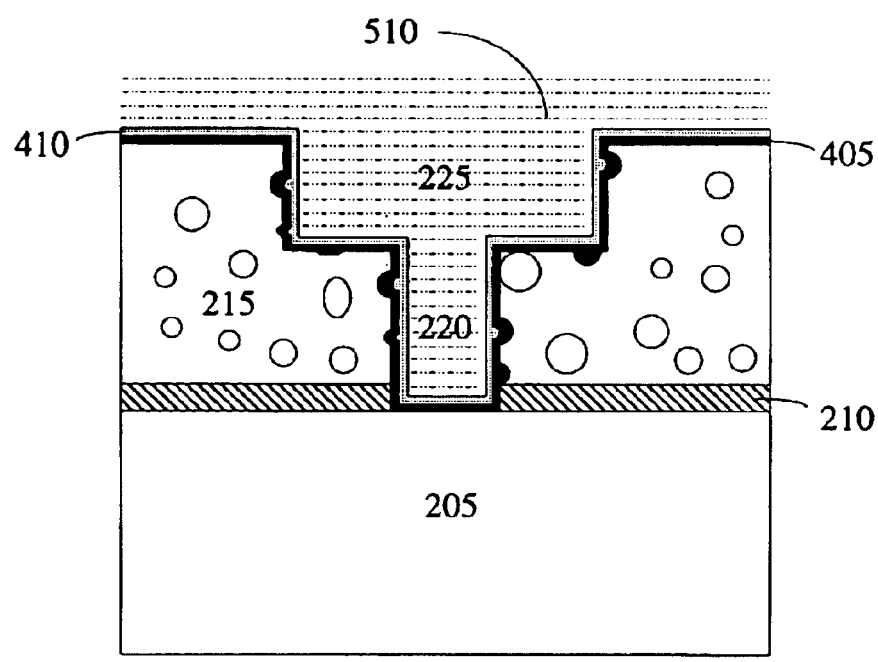
FIG. 5 illustrates the structure of FIG. 4 after copper alloy is formed over the barrier layer, so as to fill the via and the trench.

Next, an ordinary plating process is used to form the copper or copper alloy layer 510, as shown in FIG. 5.

Figure 6:
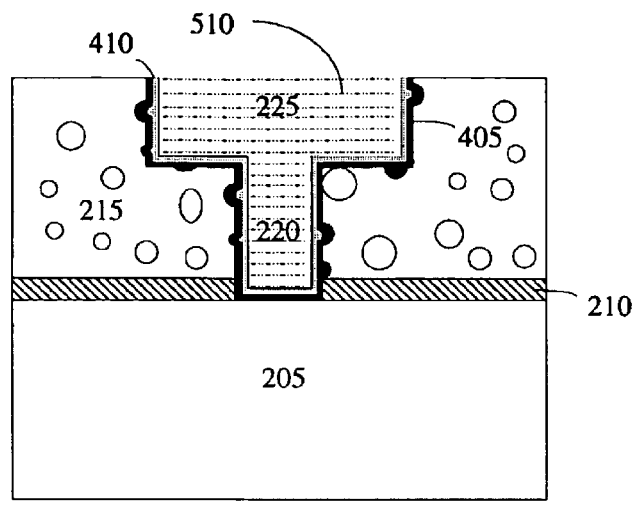
FIG. 6 illustrates the structure of FIG. 5 after the copper alloy is planarized.

As shown in FIG. 6, the structure of FIG. 5 is now planarized, removing copper alloy layer 510, barrier layer 410, and interfacial carbide layer 405 from the upper surface of the dielectric.

As an illustrative example, planarizing can be done by either chemical-mechanical polish (CMP) or electropolishing. Both CMP and electropolishing techniques for planarizing are well known. Electropolishing and related technology is described in U.S. Pat. Nos. 5,096,550; 6,017,437; 6,143,155; and 6,328,872.

Furthermore, these methods described above may be repeated to create multilayered interconnect structures.

Thus, as explained above using hydrocarbon plasma treatment on the surface of porous dielectrics, allows one to use thinner barrier layers to protect from diffusion and penetration of copper atoms and plating solution. Therefore, a thinner barrier layer takes up less volume in a via or a trench decreasing the resistance by increasing the volume available for copper. The foregoing description has been in reference to specific embodiments thereof. It will, however, be evident that various modifications and changes can be made thereto without departing from the broader spirit and scope of the invention as set forth in the appended claims. Therefore, the scope of the invention should be limited only by the appended claims.

What is claimed is:

1. A method of treating porous dielectric materials comprising:

treating the surface of a porous dielectric material with hydrocarbon plasma, so as to deposit a carbon-rich polymer material on the surface of the porous dielectric material; and depositing a barrier material over the carbon-rich polymer material, so as to line the vias and the trenches.

2. The method of claim 1, wherein the barrier material is comprised of tantalum.

3. The method of claim 1, wherein the barrier material is comprised of tantalum nitride.

4. The method of claim 1, wherein the hydrocarbon plasma is comprised of $C_2H_4$.

5. The method of claim 1, wherein the porous dielectric material is polymer material.

6. The method of claim 1, wherein the porous dielectric material is a non-organic material.

* * * * *